US008760407B2

(12) United States Patent  
Chun

(10) Patent No.: US 8,760,407 B2
(45) Date of Patent: Jun. 24, 2014

(54) DISCONNECTION OR RECONNECTION OF EXTERNAL DEVICE TO OR FROM A COMPUTER

(76) Inventor: Dukkyu Chun, SeongNam-shi (KR)

( * ) Notice: Subject to any disclaimer, the term of this patent is extended or adjusted under 35 U.S.C. 154(b) by 380 days.

(21) Appl. No.: 12/661,557

(22) Filed: Mar. 22, 2010

(65) Prior Publication Data

US 2011/0227830 A1 Sep. 22, 2011

(51) Int. Cl.
*G06F 3/02* (2006.01)
(52) U.S. Cl.
USPC .......................................... 345/172; 345/168
(58) Field of Classification Search
USPC ........................................................... 345/168
See application file for complete search history.

(56) References Cited

U.S. PATENT DOCUMENTS

| | | | |
|---|---|---|---|
| 2005/0050339 A1* | 3/2005 | Himmel et al. ............... 713/189 |
| 2006/0242362 A1 | 10/2006 | Hanes | |
| 2007/0025195 A1* | 2/2007 | Oh et al. ..................... 369/30.03 |
| 2007/0124780 A1* | 5/2007 | Lee .............................. 725/89 |
| 2008/0024452 A1* | 1/2008 | Ford et al. .................... 345/169 |
| 2008/0126595 A1* | 5/2008 | Davis et al. ..................... 710/19 |
| 2008/0140873 A1 | 6/2008 | Stemmer | |
| 2008/0140901 A1 | 6/2008 | Corrion | |
| 2009/0327979 A1* | 12/2009 | Haverinen et al. ............ 715/864 |

FOREIGN PATENT DOCUMENTS

| | | |
|---|---|---|
| CN | 101236458 | 8/2008 |
| KR | 10-0499424 | 7/2005 |
| KR | 10-2004-0107350 | 6/2006 |
| KR | 1020040107350 | 6/2006 |
| KR | 10-2007-0013404 | 1/2007 |
| WO | WO98/52186 | 11/1998 |

OTHER PUBLICATIONS

Author Unknown, Features, "safelyremove.com" web page, p. 2, date unknown, US.
Danny Mendez, How to create shortcut/hotkey combo for safely remove hardware box, Download Squad Web page, Mar. 14, 2008, pp. 1-2, US.
ITU-T, E.161 Series E: Overall Network Operation, Telephone Service, Service Operation and Human Factors, Feb. 2001, Geneva.

* cited by examiner

*Primary Examiner* — Jonathan Boyd

(57) ABSTRACT

One embodiment of this invention provides an apparatus for disconnecting and reconnecting an external device to or from a computer (system) having a key of keyboard, key-like button in anv location in the computer system and internal software process recognizing specific patterns of key strokes resulting from distinctive software capability.

8 Claims, 9 Drawing Sheets

DISCONNECTION OR RECONNECTION OF EXTERNAL DEVICE TO OR FROM A COMPUTER

CROSS-REFERENCE TO RELATED APPLICATIONS

Not Applicable

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

INCORPORATION-BY-REFERENCE OF MATERIAL SUBMITTED ON A COMPACT DISC

Not Applicable

BACKGROUND OF THE INVENTION

1. Field of the Invention

One aspect of the invention relates to disconnection or reconnection of an external device to or from a computer. In addition, one aspect of the invention provides means to interpret various key-pressing activities of computer system keyboard into novel capabilities.

2. History of the Related Art

When removing a portable, removable external device connected to a computer or computer system, it is highly recommended that a user should go through a set of steps for disconnection of the external device. Depending on the internal condition of the removable device, it is unsafe, resulting in loss of information and possibly unrecoverable internal damage to the external device, if the device is simply removed (unplugged) from the connected computer system without a certain procedure for disconnection. Manufacturers of the removable external device and/or Operating System of Personal Computer system provide software to perform a set of steps for disconnection, to prepare for safe removal of the external device. In Microsoft Windows, this software is called as Safely Remove Hardware. In this invention, a term "safe disconnection" will be utilized for a software for disconnection of external device.

As common practice, a user clicks a miniature icon in the system tray located at the bottom right corner of the Windows (Registered Trademark) graphical user interface (GUI) screen. The related icon is one of many icons in the system tray. In the prior art, this operation is cumbersome as the icon is small in size and the location is far at the bottom right corner. A prior art has put together a means with related software application. The art can be implemented in conjunction with global hotkey, which is to press a predetermined set of multiple keys at the same time for duration. This duration is prolonged as multiple keys need to be pressed concurrently. A different method of accessing the prior art is to execute the prepared application software through normal instantiation means, meaning launching a program from a prepared icon on the Desktop of computer system.

In addition, prior arts do not provide means to interpret various key-pressing activities of computer system keyboard. When a key of computer system keyboard is pressed, the specific key-code is generated and the specific capability linked to the specific key-code is performed. For one example, key "a" is pressed, the key-code for "a" is generated and the specific capability assigned to the key-code "a" is performed. If the assigned capability in this example is to take the alphabet "a", then the alphabet "a" is taken. Thus, when the alphabet "a" is pressed twice in a short time interval or any time interval, the alphabet "a" is taken twice. Prior arts do not differentiate whether a specific key is pressed multiple times in a short interval or not. The Prior arts in the computer system keyboard lack means to interpret various key-pressing activities, such as but not limited to double-press and triple-press of key, into entirely different capability. While there is differentiated capability of single-click and double-click of the mouse input, prior arts do not provide means to conclude double-press and triple-press of key on the computer keyboard.

BRIEF SUMMARY OF THE INVENTION

Some embodiments of this invention provide methods and apparatuses for disconnecting and reconnecting an external device to or from a computer. Specifically, one embodiment of the invention comprises an additional apparatus of a computer system comprising a computer and external devices to provide a new technique for the control of disconnecting operations.

Yet, another embodiment of the invention provides a means to detect and determine a pattern of key-pressing and/or key strokes of the additional apparatus and any other keys on the keyboard of a computer system. This summary does not limit the scope of this invention.

Yet, another embodiment of the invention provides differentiated means of graphical user interface for optimal operations.

BRIEF DESCRIPTION OF THE SEVERAL VIEWS OF THE DRAWINGS

The invention will be more fully understood when reference is had to the following detailed description of the prior arts and preferred embodiment of the invention that accompany drawings, in which.

DETAILED DESCRIPTION OF THE INVENTION

Figure 1:
FIG. 1 is an illustration of the access means provided by the Windows operating systems to the Safe Remove Hardware.

Referring first to the FIG. 1, 100 illustrates an example of the Windows (registered trademark) operating system's system tray where 101 is one of many miniature icons for Safely Remove Hardware operation of which the capability is provided by Windows (registered trademark) operating system. The icon 101 shows that there is at least one removable external device connected to the computer system. Hovering over the pointing-arrow on the top of 101 shows the text "Safely Remove Hardware". Single-clicking the icon, the subsequent operation is instructed to disconnect the removable external device or devices. The system tray 100 typically resides in the bottom right corner of a computer screen and the icon 101 is smaller than other typical size icons, making Safely Remove Hardware operation difficult.

Figure 2:
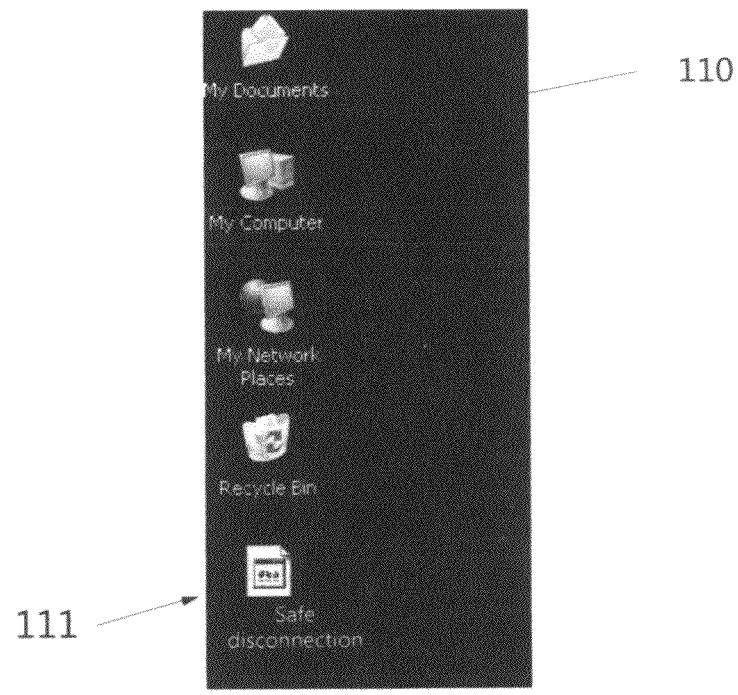
FIG. 2 is an illustration of an access means to Safe Remove application software in a prior art.

Referring to the FIG. 2, Windows Desktop portion 110 illustrates a simple but atypical arrangement Windows Desktop where shortcut icon 111 is one of many icons in order to access safe disconnection operation of which the capability is provided by prior art application software. Depending on users, there can be tens of other icons on the Desktop area 110, making difficult to select the Safe Remove Application 111 among tens of icons. Yet, the Desktop 111 is typically not exposed to users all the time, disallowing direct and/or one touch access to the application icon. More often, the display area is occupied with many applications such as Web browser, Microsoft Office (Registered trademark) applications and any other user specific software applications as the multitudes of applications are piled up one over another. In order to access the shortcut icon 111 of Safe Disconnection Application in the prior art, the other applications on the display screen area need to be cleared for making the icon 111 visible to a user. While there is one touch "show desktop" capability provided by the Windows operating system, the "show desktop" may not be easily accessible to certain users. Yet, the "show desktop" operation minimizes all applications in order to clear the entire Desktop into the initial condition thus bringing back the desired application that had been minimized causes inconvenient and redundant operational procedure.

Figure 3:
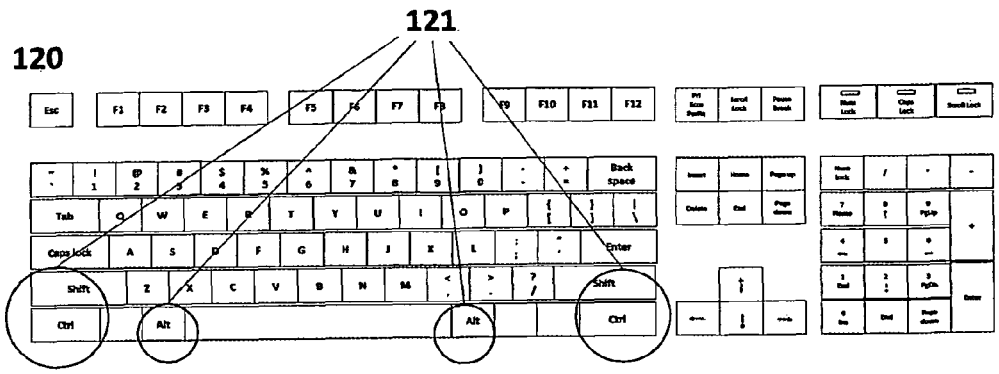
FIG. 3 is an illustration of an IBM/Windows keyboard layout.

Referring to the FIG. 3, keyboard layout 120 illustrates IBM/Windows keyboard layout where 121 collectively shows the typical keys employed for global hotkeys for any related purposed operations and in this case safe disconnection operation of which the capability is provided by operating system and application software of prior art. The global hotkeys are user-defined combination of Ctrl, Alt, Shift key and other alpha-numeric keys. Concurrently pressing a user-defined combination of these keys activates the predefined Safe Disconnection Application of the prior art. A graphical user interface screen normally shows up and the subsequent operation is instructed to safely remove and/or disconnect the removable external device or devices. While the access is simple, yet it is limited to the definition and configuration of user-defined combination of related key strokes. Often, the confliction among applications and operating system limits the choice of global hotkey selection for prior art.

Figure 4:
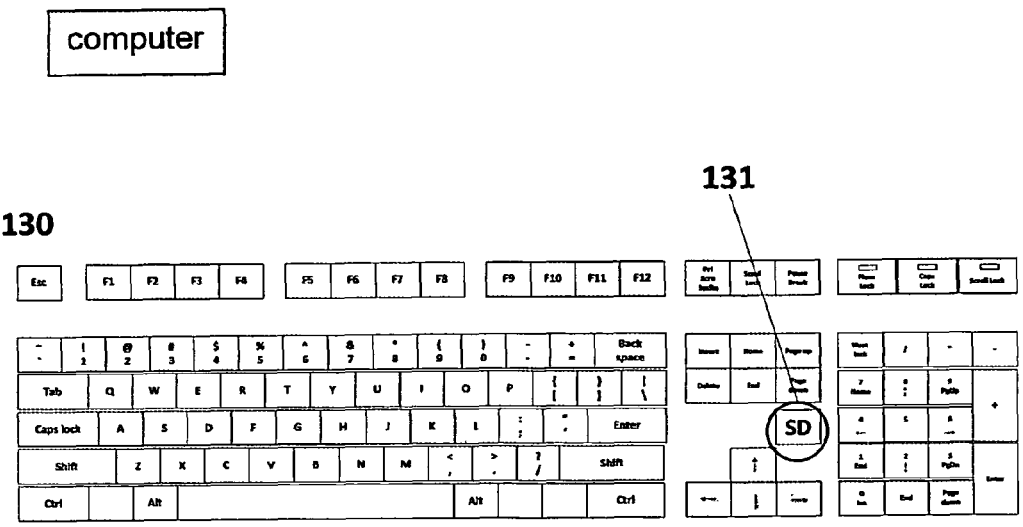
FIG. 4 is an illustration of a keyboard layout according to one embodiment of this invention and a computer.

One aspect of the invention provides selectively necessary means pertaining to the exactly desired operation with the least number of key strokes and yet very precise operational scenarios. Referring to the FIG. 4, the layout 130 illustrates the invention keyboard layout according to one embodiment of this invention, where 131 is an additional key for predetermined specific capability in conjunction with safe disconnection application software for the use of controlling removable external hardware device disconnection and/or reconnection process. The external device may be external removable storage devices or any other removable device for which safe disconnection procedure can be recommended, such as but not limited to universal serial bus (USB) memory storage device, MP3 player, digital camera, a flash device, a hard drive, a video device, an IEEE 1394 device, a phone, or a memory card reader. "Reconnection" refers to a computer internal process that results in the device being ready for access.

Figure 5:
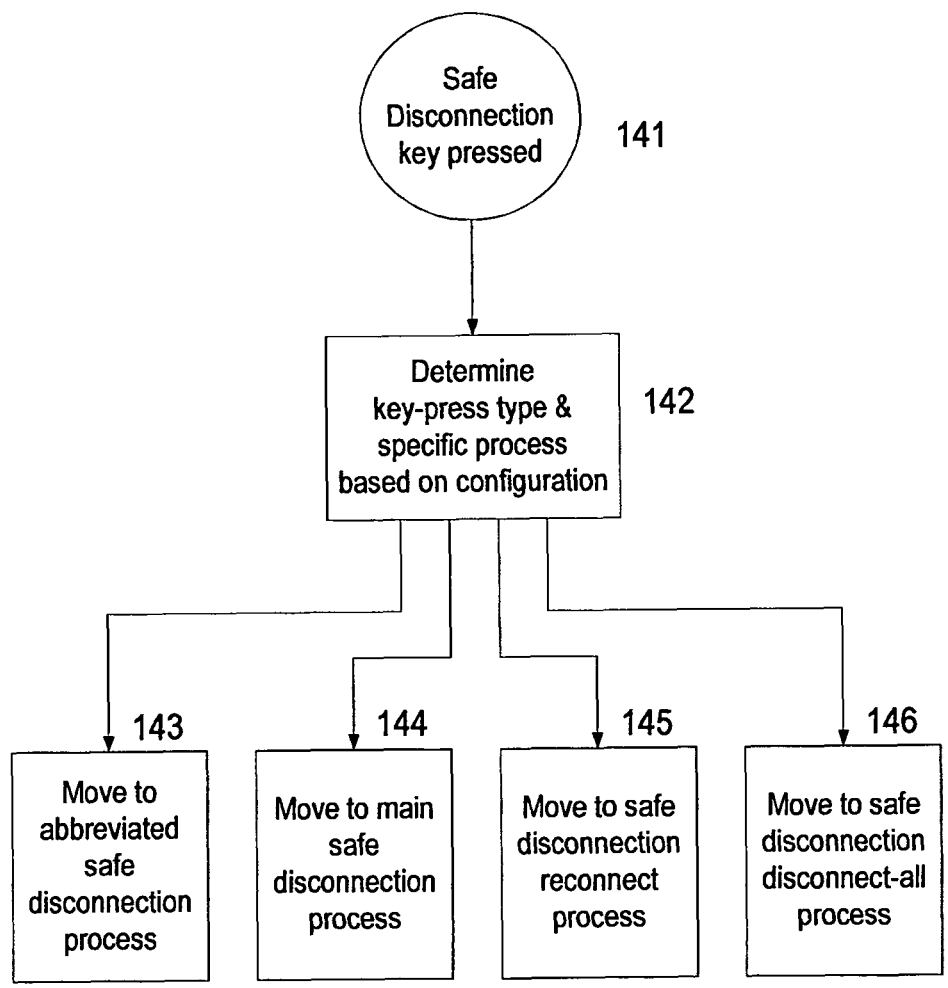
FIG. 5 is an illustration of safe disconnection application's decision process.

The FIG. 5 illustrates the computer systems internal process of the safe disconnection application and the initial decision making portion of safe disconnection application. The safe disconnection application had been readily started during the start-up of computer operating system and is waiting for specific input (waiting state). When a user presses the safe-disconnect (SD) key 131 of FIG. 4, the operating system detects the SD key being pressed and identifies that the SD key is associated with the safe disconnection application. The operating system gives the SD key input and the control to the safe disconnection application process as illustrated in the process 141 of the FIG. 5. The safe disconnection application of the FIG. 5, when given the control by the operating system, determines the key-press type as shown in the process 142. The key-press type herein refers to certain regularity and/or pattern of key strokes. The SD can be pressed once as a user normally presses a computer keyboard key, twice in a short time interval, three times in a short time interval, four times in a short time interval or prolonged press. In order to further exemplify user activity, the invention introduces the new terms single-press, double-press, triple-press, quadruple-press and long-press. The concept of the new terms is apparent when commonly known terms such as single-click, double-click, triple-click and quadruple-click are taken into consideration. The term single-press is one time press in a normal manner, which the activity is similar to single-click of mouse while the pressing action in this case is applied to a computer keyboard key. The term double-press is the activity similar to double-click of mouse while the pressing action in this case is applied to a computer keyboard key. The term triple-press is the activity similar to triple-click of mouse while the pressing action in this case is applied to a computer keyboard key. The term quadruple-press is the activity similar to quadruple-click of mouse while the pressing action in this case is applied to a computer keyboard key. The time interval between the key-presses is programmable as the time interval between the mouse-clicks is programmable. In fact, the same value may be used to determine different types of key press. In addition, a computer can differentiate between a short press and long press. When the duration of the SD key being pressed exceeds yet another pre-defined interval such as but not limited to one second, the process 142 concludes as a long-press. Otherwise, the process 142 concludes as a short-press. The pre-defined interval for making decision for the single-press or long-press is a programmable entity within the safe disconnection application.

In other words, short-press of a key is determined as the key being pressed and remaining in the pressed state for a predetermined duration or less. Long-press of a key is determined as the key being pressed and remaining in the pressed state longer than a predetermined duration.

Single-press of a key is determined as the key having one time of short-press, and not being followed by the same key press within a predefined time duration. Double-press of a key is determined as the key having two times of short-press for which the time gap between the short-presses is a predetermined duration or less. Triple-press of a key is determined as the key having three times of short-press for which each time gap between the short-presses is a predetermined duration or less. Quadruple-press of a key is determined as the key having four times of short-press for which each time gap between the short-presses is a predetermined duration or less.

The process 142 determines user activity based upon predefined criteria and as the result of this decision, the user activity can be concluded to single-press, double-press, triple-press, quadruple-press or long-press of SD key. And based upon predefined programmable linkages to the processes of the safe disconnection application, single-press, double-press, triple-press and long-press of SD key can be respectively assigned to abbreviated safe disconnection process, safe disconnection reconnect process, safe disconnection disconnect-all process and main safe disconnection process. The relationship and/or linkage of types of key-press and assigned functionality are not permanently fixed but programmable. The safe disconnection application can be configured for the relationship and/or linkage based on user's preference. The processes 143, 144, 145 and 146 illustrate that the control of the safe disconnection application is given to one of the abbreviated safe disconnection process, main safe disconnection process, safe disconnection reconnect process and safe disconnection disconnect-all process.

Figure 6:
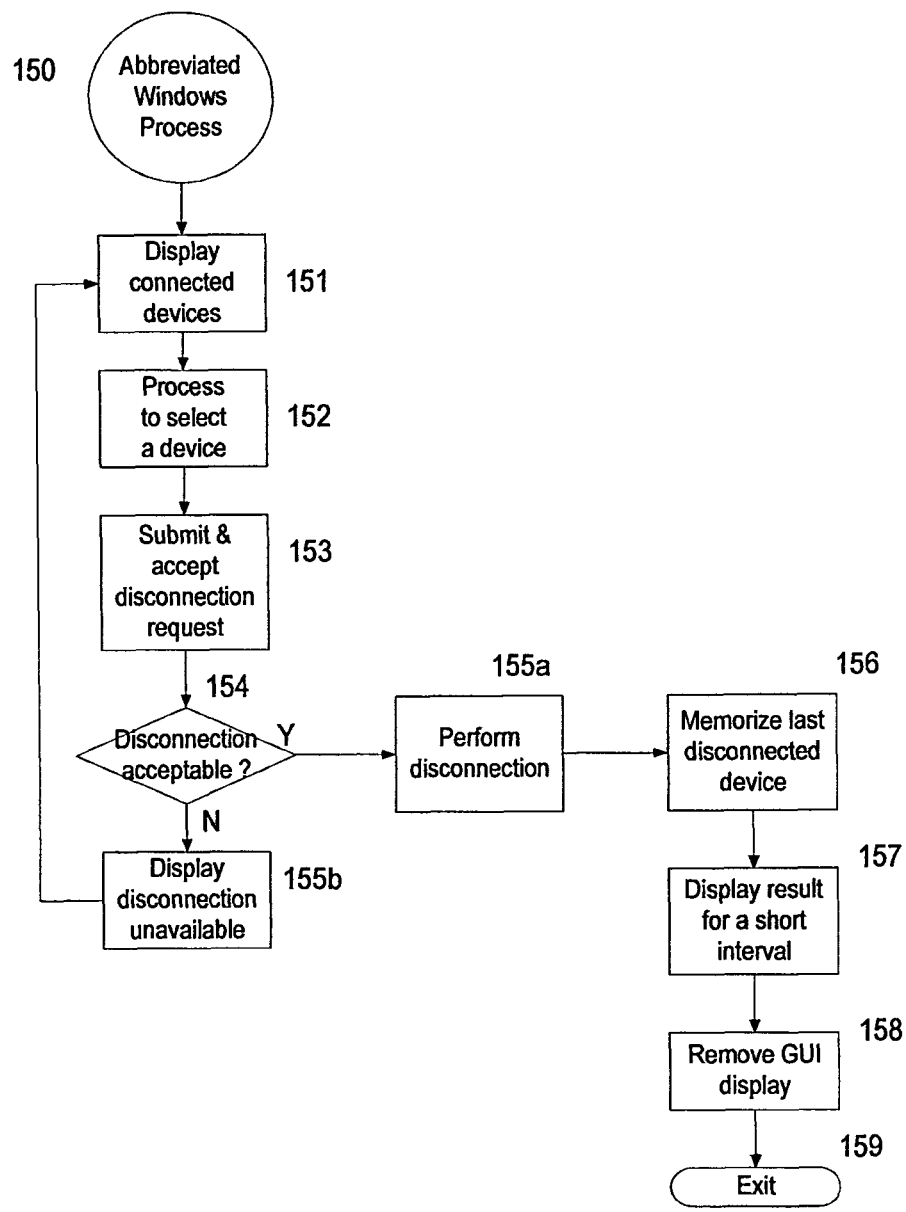
FIG. 6 is an illustration of abbreviated windows processing flowchart for the safe disconnection application.
Figure 10:
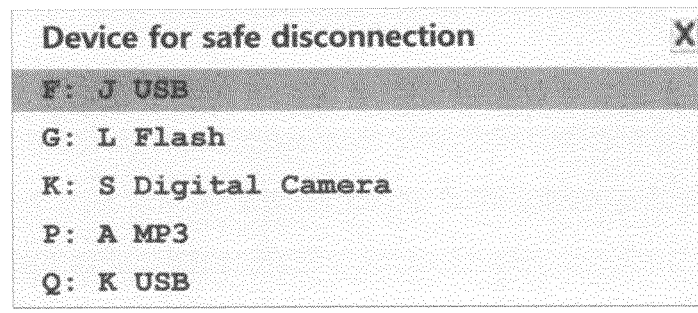
FIG. 10 is a sample illustration of safe disconnection application's graphical user interface for abbreviated operational windows.

The FIG. 6 illustrates a process of the abbreviated safe disconnection operation which is intended to disconnect one connected device at a time and to immediately return to the previously operational application with no further user intervention. Upon receiving user's request determined by the process 142 of FIG. 5 and the request is concluded as an abbreviated disconnect request, it moves to the process 150 which subsequently shows the list of devices connected to a computer ("device list") as shown in the process 151. The FIG. 10 illustrates an example of abbreviated safe disconnection graphical user interface. This figure displays a sample list of connected devices and provides means of selecting specific device through graphical user interfaces. Then, the process 152 selects a specific device for further operation, namely disconnection. Within the process of 152, a user may scroll for a selection of external device with arrow keys, or directly enter drive designation letter. The process 153 illustrates that request for disconnection of the selected device is submitted to a connected computer. Process 154 makes a determination on whether the selected device is acceptable for disconnection. When the specified device is not permissible for disconnection, the process 155*b* shows that user is notified of the unavailable condition of the specified device. When the specified device is permissible for the disconnection, it proceeds to process 155*a* to perform disconnection and shows the successful result of the request as shown in the process 157. In process 155*a*, a computer performs tasks to prepare for safe removal of the selected external device, such as, but not limited to writing caches to the external device and logically severing the external device from a computer.

When this short time interval of the display expires, the process 158 shows that the display is removed from the screen and the abbreviated safe disconnection process exits without user interaction as shown in the step 159. The exit of the abbreviated safe disconnection process means a return to the master decision process 142 of the FIG. 5, waiting for user's input. A short interval of displaying successful result of abbreviated safe disconnection is a user configurable parameter. The process 156 illustrates that the lastly disconnected device is memorized for the future reconnection purpose. In this invention (including claims), "Disconnection" (from a computer) is a computer process for task(s) to prepare for safe removal (physical unplugging) of external device(s) from a computer, such as, but not limited to, writing caches to the external device and logically severing the external device from a computer. It results in a state wherein a user can safely remove external device(s) from a computer without causing damage to the external device(s). In this invention (including claims), "to disconnect" external device(s) (from a computer) means to perform disconnection (process) of the external device(s).

Figure 7:
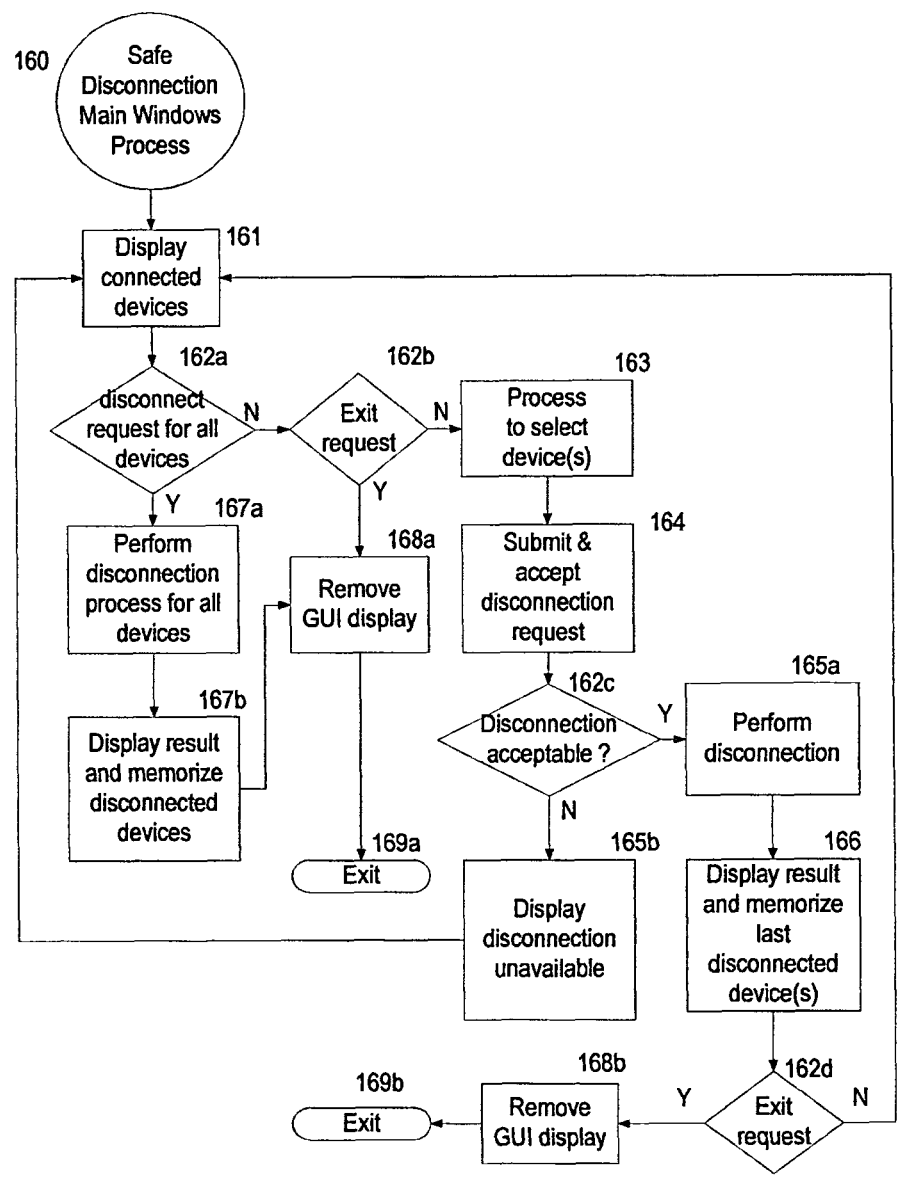
FIG. 7 is an illustration of main windows processing flowchart for the safe disconnection application.
Figure 11:
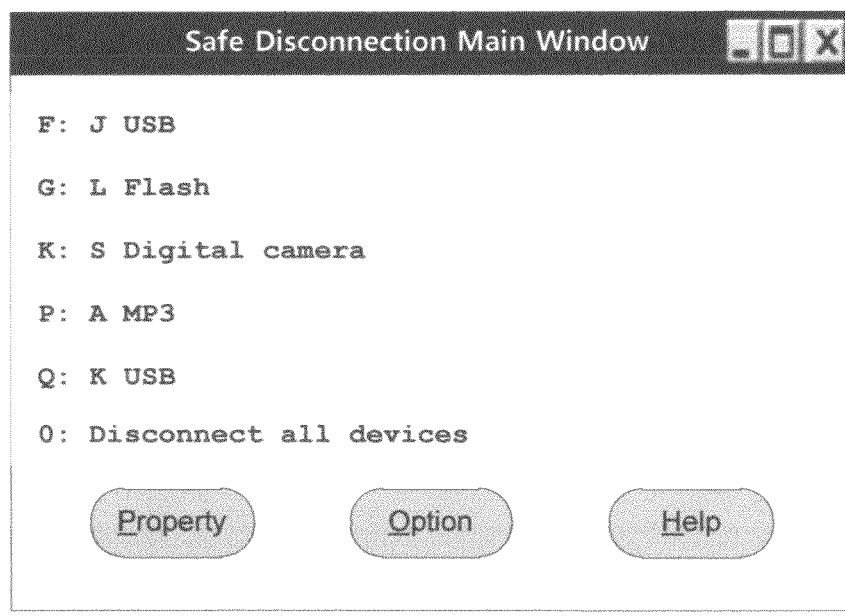
FIG. 11 is a sample illustration of safe disconnection application's graphical user interface for main windows.

The FIG. 7 illustrates main process of the safe disconnection application which is intended to disconnect any number of connected devices. Upon receiving user's request determined by the process 142 of FIG. 5 and the request is concluded as main process request, the safe disconnection process moves to the process 160 and subsequently it shows the device list as shown in the process 161. The FIG. 11 illustrates a sample of safe disconnection main graphical user interface. The main graphical user interface of the safe disconnection also provides means as to configure the user options and preference of operating the application. Additionally, through the main graphical user interface of the safe disconnection, a user can specify many configuration parameters such as but not limited to the long-press duration for process 142 and short display duration of process 157 so that the long-press can be concluded and the duration of the display expires respectively. Upon showing the list of connected devices as illustrated by the process 161, the main safe disconnection process takes input from a user. A user may choose option tab as shown in 211 of the FIG. 11 in order to change the configuration parameters and preference. Otherwise the main safe disconnection process takes input for the safe disconnection process. When a user enters certain selection, the process 162*a* checks if the selection is to request to disconnect all devices. If the command is identified as the request for disconnect all devices, there may be a prompt for user's confirmation and the process 167*a* performs disconnection of all devices. In process 167*a*, a computer performs tasks to prepare for safe removal of the external devices. There may be devices ready for disconnection thus successfully disconnected and there may be devices not ready for disconnection thus resulting in the failure. The result, whether successful or failed, of all devices is displayed as shown in the process 167*b* which also memorize the list of successfully disconnected devices for the future reconnection purpose. When this short time interval of the display expires, the process 168*a* is started that the display is removed from the screen and the main safe disconnection process exits without user interaction as shown in the step 169*a*. If a user selected input is not a request for disconnect all devices, it still can be a request to exit. If the command is a request to exit, the process 168*a* is started that the display is removed from the screen and the main safe disconnection process returns to the master decision process 142 of the FIG. 5, waiting for a user's command input. If the command is not a request to exit as shown in process 162*b*, it is a request to perform safe disconnection process. The process 163 selects a specific device or devices for further operation, namely disconnection. During the process of 163, a user may scroll for a selection with arrow keys, or directly enter drive designation letter. A user can enter multiple drive letters and then press ENTER Key, to select and request disconnection of multiple devices at one time, for example. The process 164 shows acceptance of the request to perform disconnection operation of the selected device or devices. Receiving user's request as shown in the process 164, the process 162*c* makes a decision after the internal process verifies the specified device(s) is (are) in the state where the disconnection internal process is permissible. When one or more specified devices are not permissible for disconnection process, the process 165*b* shows that user is notified of the unavailable condition of the specified device(s). When all of the specified devices are permissible for the disconnection, it proceeds with the disconnection process 165*a* and shows the successful result of the request as shown in the step 166. In process 165*a*, a computer performs tasks to prepare for safe removal of the external device(s). When the result of disconnection is displayed, a user may select to exit the application as shown in the step 162*d*. The safe disconnection process terminates when a user specifically issues a command to exit from the application. Upon receiving a command, the internal process 167 checks if the given input is for a request to exit. If the command is a request to exit, the safe disconnection process 168*b* removes all displays from the screen and the main safe disconnection process exits as shown in the step 169*b*. The exit of the main safe disconnection process means a return to the master decision process 142 of the FIG. 5, waiting for user's input. If the command is not a request to exit, the safe disconnection internal process is transitioned to the process 161 where the updated list of connected devices is displayed.

Figure 8:
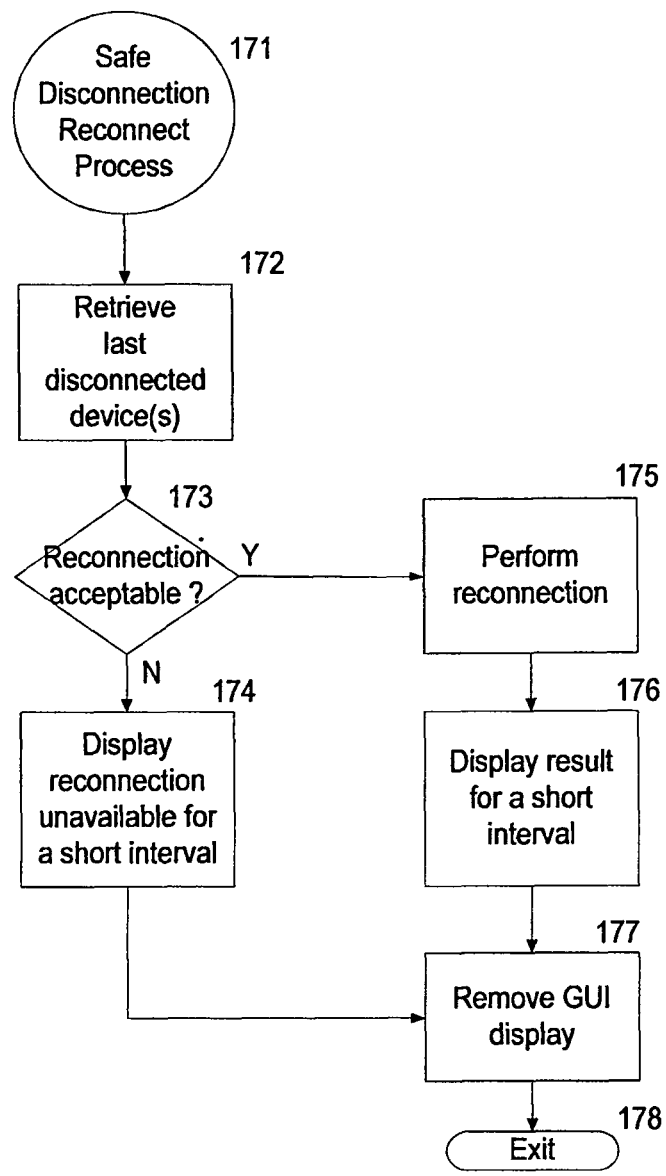
FIG. 8 is an illustration of reconnect processing flowchart for the safe disconnection application.

The FIG. 8 illustrates the reconnect process of the safe disconnection application. The reconnect process is intended to reconnect the last disconnected device or devices. Upon receiving user's request determined by the process 142 of FIG. 5 and the request is concluded as a reconnect request, the safe disconnection process moves to the process 171 and subsequently the process 172 retrieves the information as to the last disconnected device or devices. There can be one or more last disconnected devices. And the device(s) may not be physically available for reconnection. If the specified device is not available for reconnect as shown in the step 173, the process 174 displays the unavailable status of the device. When this short time interval of the display expires, the process 177 shows that the display is removed from the screen and the reconnect process of the safe disconnection application exits without user interaction as shown in the step 178. If the specified device(s) is available for reconnection, the process 175 performs reconnection and the result of the reconnected device is displayed as shown in the process 176. When this short time interval of the display expires, the process 177 illustrates that the display is removed from the screen and the reconnect process of the safe disconnection application exits without user interaction as shown in the step 178. The exit of reconnect process of the safe disconnection application means a return to the master decision process 142 of the FIG. 5. A short interval of displaying the result of reconnect status is a user configurable parameter.

Figure 9:
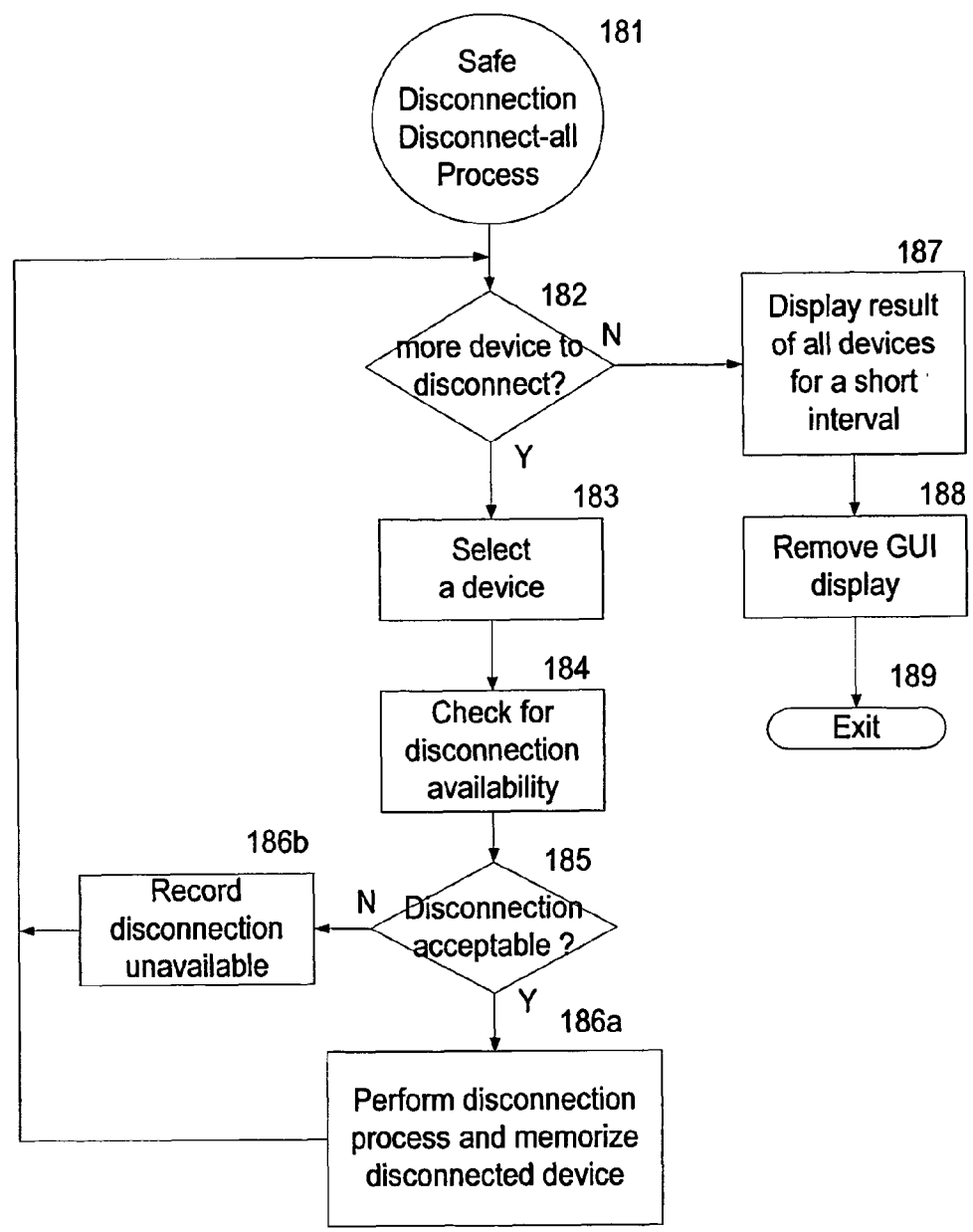
FIG. 9 is an illustration of disconnect all devices processing flowchart for the safe disconnection application.

The FIG. 9 illustrates the disconnect-all-devices process of the safe disconnection application. The disconnect-all-devices process is intended to disconnect all available device or devices without further user interaction. Upon receiving user's request determined by the process 142 of FIG. 5 and the request is concluded as a disconnect-all-devices request, the safe disconnection process moves to the process 181. There can be zero, one or multiple connected devices. And there can be zero, one or multiple connected devices not available for disconnection process. The process 182 illustrates that it first checks for one or more devices for disconnection. If there is any removable external device for disconnection, the process 183 selects a device, usually the next device in the connected device list, for disconnection. The selected device may or may not be in permissible state for disconnection as checked in the step 184. Thus the process 185 validates if the selected device is permissible for disconnection. If not permissible, the process 186*b* records the selected device is unavailable for disconnection, which will be presented to the user interface screen by the process 187. If the selected device is permissible for disconnection, the process 186*a* performs the disconnection and records the result of it, which will be presented to the user interface screen by the process 187. The process 186*a* makes the list of all successfully disconnected devices for the future reconnection purpose. If there is no more removable external device for disconnection, the process 187 displays the result of the status of all devices for a short time interval. When this short time interval of the display expires, the display as shown in the process 188 is removed from the screen and the disconnect-all-devices process of the safe disconnection application exits without user interaction as shown in the process 189. A short interval of displaying the resulting status of all devices of interest is a user configurable parameter.

Figure 12:
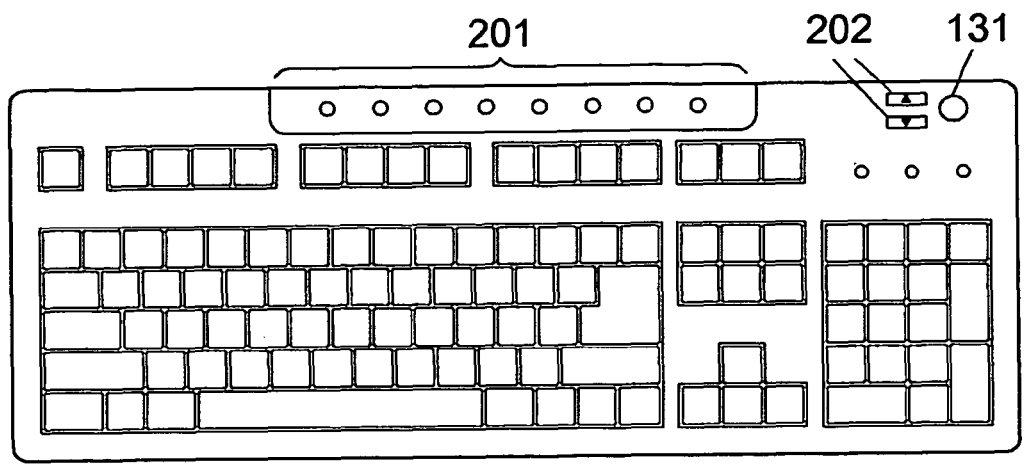
FIG. 12 is an illustration of a keyboard according to one embodiment of this invention.

As disclosed above, an additional special function key was utilized for predetermined functions for disconnecting or reconnecting external device. It should be noted that SD Key is just one example, and does not confine this invention. SD Key 131 can be placed anywhere on a keyboard, and may take a form of a button. According to one embodiment, as illustrated in FIG. 12, SD Key 131 can be conveniently positioned as a special purpose key on the upper part of the keyboard, along with other conventional special purpose keys 201. And SD Key 131 was also accompanied by adjacently positioned up down arrow keys 202. Special purpose keys, which are also called as special keyboard buttons, hotkeys, or shortcut keys, are additional keys or buttons to provide direct access to predetermined specific functions such as volume control, sending e-mail, launching a browser, calculation etc. In this embodiment, to disconnect a device, a user may easily press the SD Key 131 positioned at the right upper corner of the keyboard, and select an external device to be disconnected at the abbreviated or main GUI of safe disconnection with adjacently located up down arrow keys 202, and then press the SD Key 131 again, instead of ENTER Key. In this embodiment, while abbreviated or main graphical user interface of safe disconnection is displayed, single press of SD Key 131 is also utilized for selection of external device. More particularly, when abbreviated or main graphical user interface of safe disconnection, is displayed, the key code of SD Key 131 is temporarily switched to that of ENTER Key. And when abbreviated or main graphical user interface of safe disconnection is removed, the key code of SD Key 131 is returned to the original key code (flow chart not shown). The technique of switching key codes under a specific condition is well known to those who are skilled in this art, and not described in further detail. By this way, a user can perform safe disconnection operations with minimal distance of hand movements.

Up down arrow keys 202 do not necessarily require separate installation, but can be shared by other pre-existing special purpose keys.

According to one embodiment, up down arrow keys 202 in FIG. 12 function as special purpose keys to open/close pre-assigned CD/DVD trays, by default. But while abbreviated or main graphical user interface of safe disconnection is displayed, the key codes are temporarily switched so that these keys are utilized as up down arrow keys.

Figure 13:
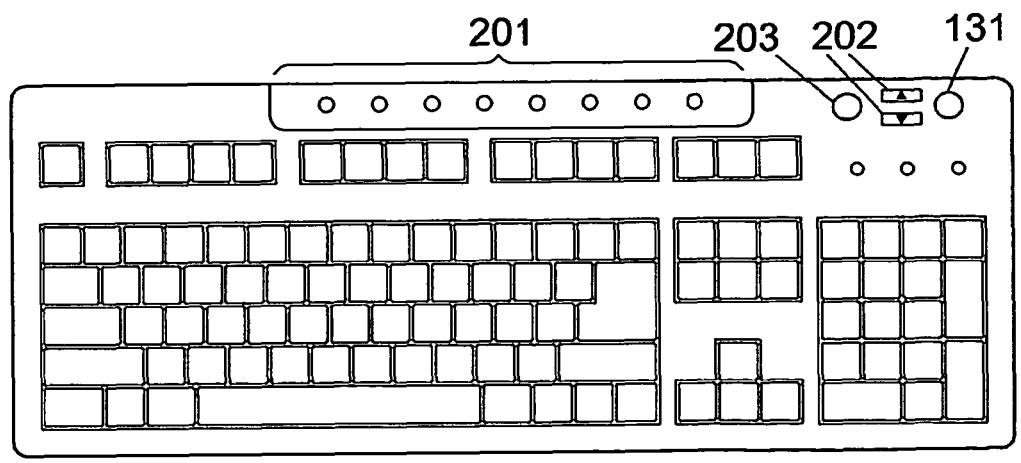
FIG. 13 is an illustration of a keyboard according to one embodiment of this invention.

According to one embodiment, as illustrated in FIG. 13, up down arrow keys 202 function as volume control keys, by default, which are accompanied by adjacently located mute key 203. But while abbreviated or main graphical user interface of safe disconnection is displayed, the key codes are temporarily switched so that these keys are utilized as up down arrow keys. By this way, a user can utilize a limited space on the keyboard more efficiently.

To briefly summarize, according to one embodiment of this invention, users can not only directly access a predefined functionality for disconnecting or reconnecting external device(s), but also perform safe disconnection operations efficiently with minimal distance of hand movements, while saving limited space on a keyboard. The invention is not restricted to the particular details listed herein. Indeed, those skilled in the art will appreciate that many other variations from the foregoing description and drawings may be made within the scope of the present invention.

The invention claimed is:

1. As a key of a computer keyboard which can be connected to a computer,
   a predetermined specific key for disconnection of external device(s), configured to request the computer to activate software program for disconnection of external device(s) and display a graphical user interface for disconnection of external device(s), the graphical user interface comprising a device list of external device(s) connected to the computer,
   the software program being configured so that a user can:
      display the graphical user interface for disconnection of external device(s);
      select external device(s) to disconnect at the graphical user interface; and
      request disconnection of selected external device(s) to the computer,
   by manipulating keys of the computer keyboard.

2. The key as set forth in claim 1, wherein the predetermined specific key is installed for disconnection of external device(s).

3. The key as set forth in claim 1,
   wherein the predetermined specific key is a special purpose key.

4. A computer keyboard comprising the predetermined specific key as set forth in claim 1.

5. The computer keyboard as set forth in claim 4, wherein the predetermined specific key is installed for disconnection of external device(s).

6. The computer keyboard as set forth in claim 4, wherein the predetermined specific key is a special purpose key.

7. The computer keyboard as set forth in claim 4, wherein the predetermined specific key is positioned close to arrow keys, and the predetermined specific key and the arrow keys are so configured that a user can:
   display a graphical user interface for disconnection of external device(s), the graphical user interface comprising a device list of external device(s);
   select external device(s) to disconnect at the graphical user interface; and
   request disconnection of selected external device(s) to a computer connected to the keyboard,
   by manipulating the predetermined specific key and the arrow keys only.

8. The computer keyboard as set forth in claim 7, wherein the predetermined specific key and the arrow keys are so configured that a user can:
   display the device list of external device(s) by manipulating the predetermined specific key at waiting state;
   select external device(s) to disconnect at the device list by manipulating the arrow keys; and
   request disconnection of selected external device(s) to the computer by manipulating the predetermined specific key again while the device list is displayed.

* * * * *